United States Patent
Tabio et al.

(10) Patent No.: US 10,195,685 B2
(45) Date of Patent: Feb. 5, 2019

(54) CAPILLARY ALIGNMENT JIG FOR WIRE BONDER

(71) Applicant: Texas Instruments Incorporated, Dallas, TX (US)

(72) Inventors: Elmer Rad Bais Tabio, Sta. Rosa (PH); Pablo E. Remogat, Jr., Mabalacat (PH); Rolando B. Zarraga, Jr., Sta. Rosa (PH); Armando U. Carrera, II, Sta. Rosa (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 243 days.

(21) Appl. No.: 15/005,172

(22) Filed: Jan. 25, 2016

(65) Prior Publication Data

US 2017/0209955 A1    Jul. 27, 2017

(51) Int. Cl.
  *B23K 20/00*    (2006.01)
  *B23P 6/00*    (2006.01)
  *H01L 23/00*    (2006.01)

(52) U.S. Cl.
  CPC ............ *B23K 20/005* (2013.01); *H01L 24/78* (2013.01); *H01L 2924/00014* (2013.01)

(58) Field of Classification Search
  CPC .................. B23K 20/005; H01L 24/78; H01L 2924/00014
  See application file for complete search history.

(56) References Cited

U.S. PATENT DOCUMENTS 5,699,951 A * 12/1997 Miyoshi ............... B23K 20/004
                                                                    228/4.5

* cited by examiner

*Primary Examiner* — John C Hong
(74) *Attorney, Agent, or Firm* — Ronald O. Neerings; Charles A. Brill; Frank D. Cimino

(57) ABSTRACT

A capillary alignment tool for installing a new capillary in the transducer on a wire bonding machine. A capillary alignment tool for installing a new capillary in a transducer on wire bonding machine. A method for installing a new capillary in the transducer of a wire bonding machine using the capillary alignment tool.

28 Claims, 6 Drawing Sheets

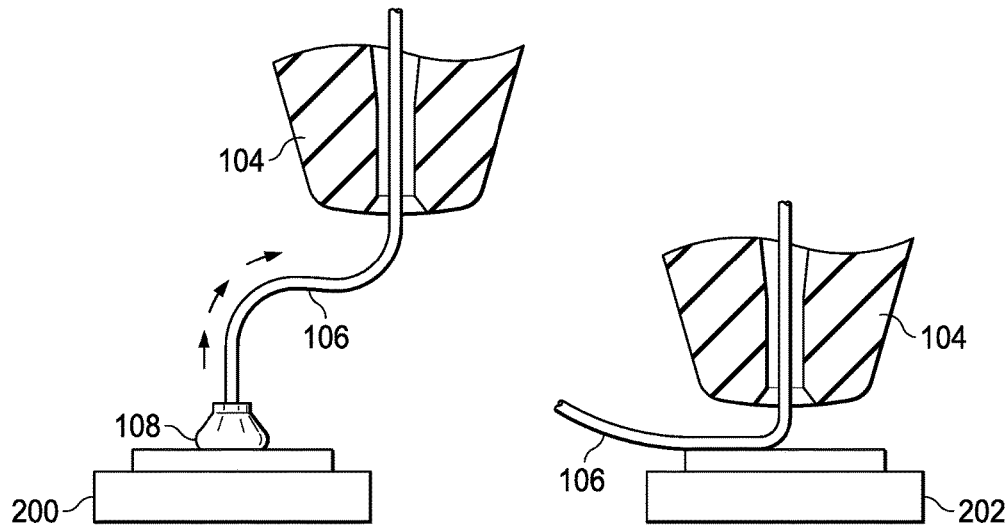
FIG. 2C
(PRIOR ART)
FIG. 2D
(PRIOR ART)
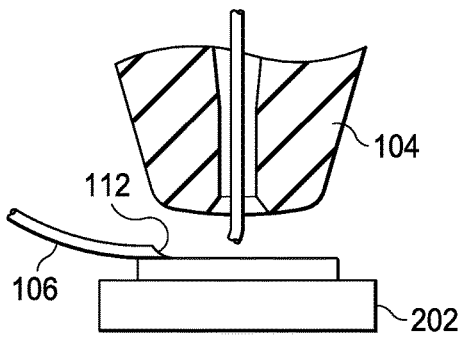
FIG. 2E
(PRIOR ART)
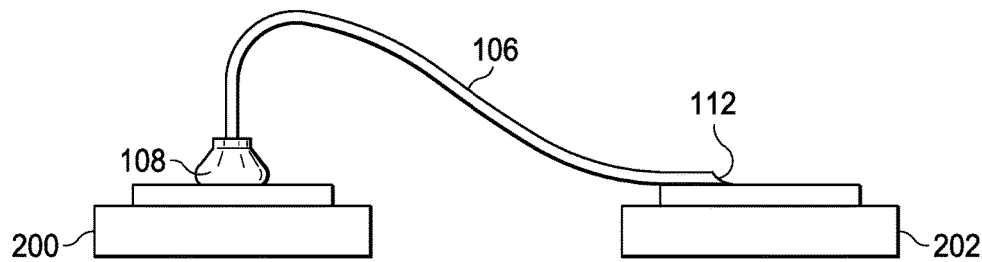
FIG. 2F
(PRIOR ART)

CAPILLARY ALIGNMENT JIG FOR WIRE BONDER

FIELD

This application relates to a wire bonding process and capillaries used in the wire bonding process during the manufacture of electronic integrated circuit chip packages. More particularly, this application relates to a wire bonding capillary alignment jig.

BACKGROUND

Integrated circuit chip packages are typically formed by mounting an integrated circuit chip on a lead frame and coupling these two elements together using wire bonding to form a package. The integrated circuit chip and lead frame are typically encapsulated after they are coupled together.

As shown in FIG. 1, a lead wire 106, typically made of gold, silver, or copper, is fed through the capillary 104. The capillary 104 is affixed in a transducer 102 which provides ultrasonic energy transfer through the capillary 104 and through the free air ball 204 which creates a micro scrubbing during formation of the $1^{st}$ bond 108 in the wirebonding process. In typical wire bonding tools the transducer 102 supplies ultrasonic energy at 60 kHz although transducers in some high frequency wire bonding tools supply ultrasonic energy at 90 kHz to 250 kHz.

The primary steps in the wire bonding process are illustrated in FIGS. 2A through 2F.

In FIG. 2A the lead wire 106 is extended below the bottom of the capillary 104. Electronic Flame Off with approximately 5,000 volts is then supplied to heat the wire causing it to melt and to form a free air ball 204 below the end of the capillary 104.

In FIG. 2B, the capillary 104 is lowered to bring the free air ball 204 into contact with a bond pad 200 of the integrated circuit. Pressure and ultrasonic energy is applied to form a ball bond 108 between the bond pad 200 and the lead wire 106.

As shown in FIG. 2C, a length of lead wire 106 is then fed through the capillary 104 and the capillary 104 is moved to position the lead wire 106 over the lead frame 202.

As shown in FIG. 2D, the capillary 104 is then lowered to bring the lead wire 106 into contact with the lead frame 202.

In FIG. 2E ultrasonic energy is applied to melt the lead wire 106 and form a stitch bond 112 between the bond wire 106 and the lead frame 202.

FIG. 2F illustrates a completed wire bond, where a ball bond 108 couples one end of the lead wire 106 to the bond pad 200 on the bond pad 200 of the IC and a stitch bond couples the other end of the lead wire 106 to the lead frame 202.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A capillary alignment tool for installing a new capillary in the transducer on a wire bonding machine. A capillary alignment tool for installing a new capillary in a transducer on a wire bonding machine. A method for installing a new capillary in the transducer on a wire bonding machine using the capillary alignment tool.

DESCRIPTION OF THE VIEWS OF THE DRAWINGS

FIGS. 2A-2F (Prior Art) are steps illustrating the formation of a ball bond and a stitch bond using a wire bonding machine.

DETAILED DESCRIPTION OF EXAMPLE EMBODIMENTS

Embodiments of the invention are described with reference to the attached figures. The figures are not drawn to scale and they are provided merely to illustrate the invention. Several aspects of the embodiments are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The embodiments are not limited by the illustrated ordering of acts or events, as some acts may occur in different orders and/or concurrently with other acts or events. Furthermore, not all illustrated acts or events are required to implement a methodology in accordance with the present invention.

The vertical alignment of the capillary 104 to the transducer 102 has a significant influence on the strength and integrity of ball bonds and stitch bonds.

Figure 1:
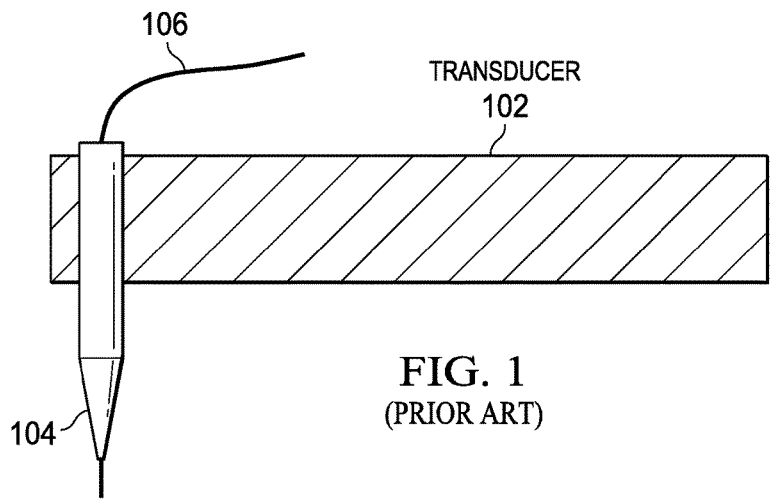
FIG. 1 (Prior Art) is a cross-section of a capillary in the transducer of a wire bonding machine.
Figure 2A:
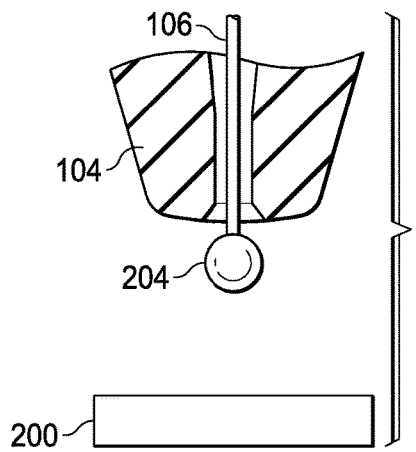
Figure 2B:
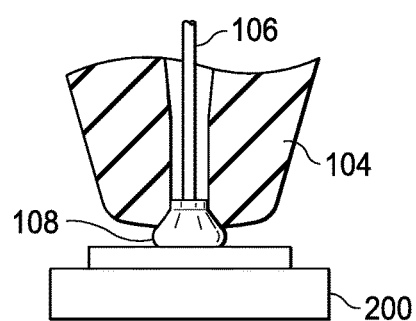
Figure 3:
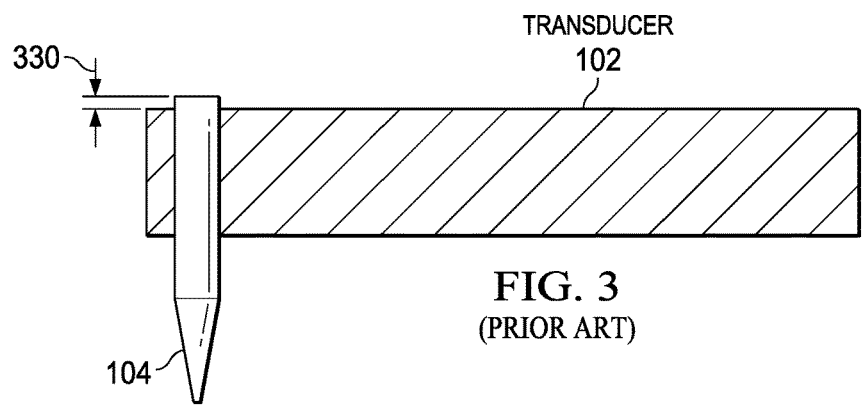
FIG. 3 (Prior Art) is a cross-section of a misaligned capillary in the transducer of a wire bonding machine.

As shown in FIG. 3, the vertical alignment 330 of the capillary 104 may change when a new capillary 104 is installed in the transducer 102. Since the down pressure of the ball 204 on the bond pad 200 is dependent upon the vertical alignment distance 330, and since the efficiency of the coupling of the ultrasonic energy into the ball bond 108 is dependent upon the down pressure, the strength and integrity of the ball bond 108 is a sensitive function of the vertical alignment distance 330.

Likewise since the down pressure of the lead wire 106 on the leadframe 202 is dependent upon the vertical alignment distance 330, and since the efficiency of the coupling of the ultrasonic energy into the stitch bond 112 is dependent upon the down pressure, the strength and integrity of the stitch bond 112 is a sensitive function of the vertical alignment distance 330.

Figure 4:
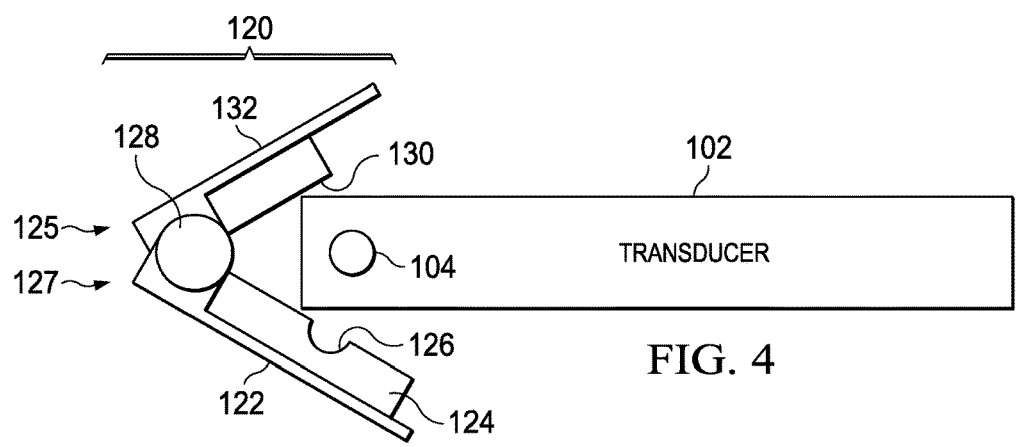
FIG. 4 is a top down view of an embodiment capillary alignment tool and a transducer.
Figure 5:
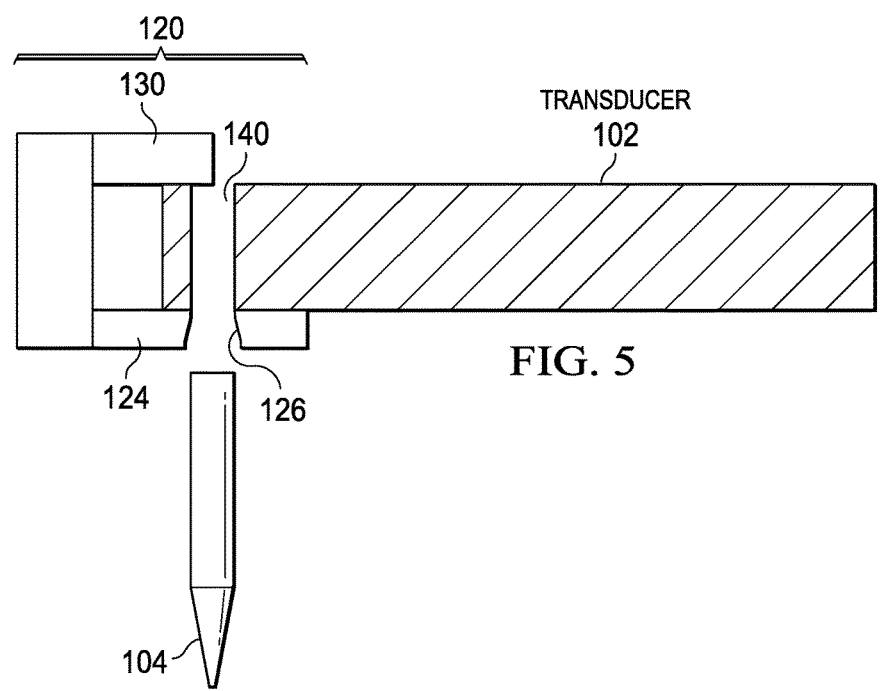
FIG. 5 is a cross section of an embodiment capillary alignment tool and a transducer.
Figure 6:
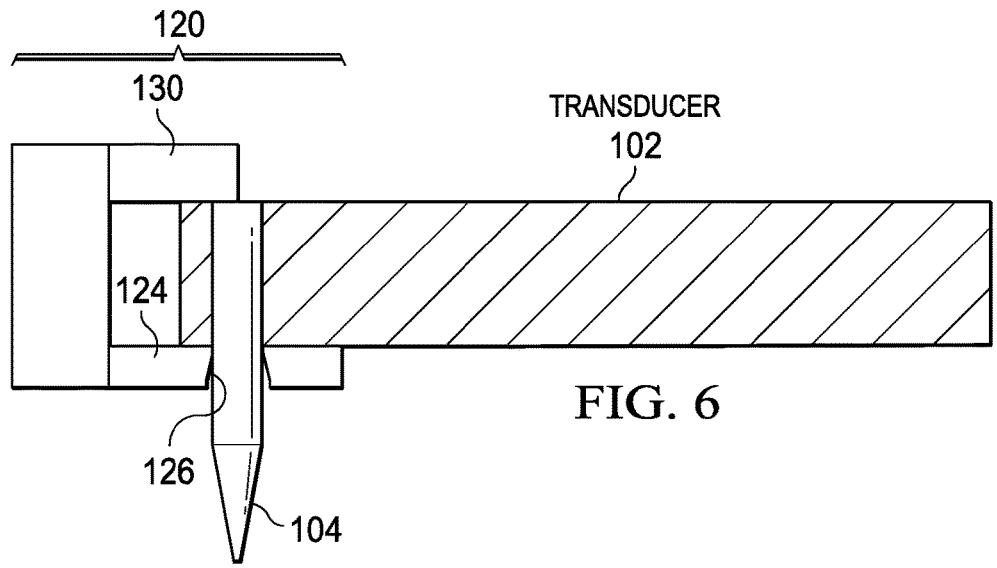
FIG. 6 is a cross section of an embodiment capillary alignment tool and a transducer.

An embodiment capillary alignment jig 120 is illustrated in FIGS. 4, 5, and 6.

As shown in the top down view in FIG. 4 the capillary alignment jig 120 is comprised of a pair of opposed arms, 125 and 127, which are coupled together by a hinge 128. The pair of opposed arms, 125 and 127 are moveable toward one another to enable side plates, 122 and 132, to grip the transducer 102 of the wire bonding machine there between when the capillary alignment jig 120 is closed.

The first arm 125 consists of first side plate 132 which grips a first side of the transducer 102 and a top plate 130 which contacts the top surface of the transducer 102 to provide vertical alignment when the opposed arms are in the closed position. The top plate 130 also at least partially covers the vertical capillary opening 140 in the transducer 102 forming a capillary stop. During replacement of the capillary 104, the new capillary 104 is inserted through the vertical capillary opening 140 in the transducer 102 and comes to stop against the top plate 130. The capillary stop ensures the same vertical alignment of the capillary 104 during each installation as is shown in FIG. 5.

The second arm 127 of the capillary alignment jig 120 is comprised of a second side plate 122 which grips a second side of the transducer 102 and a bottom piece 124 which contacts the bottom surface of the transducer 102 to provide vertical alignment when the opposed arms are in the closed position.

As shown in FIG. 6, an opening 126 in the bottom piece 124 which aligns with the vertical capillary opening 140 in the transducer 102 may be provided to aid in the installation of the new capillary 104. The opening 126 may be beveled to facilitate installation of the new capillary 104.

Figure 7A:
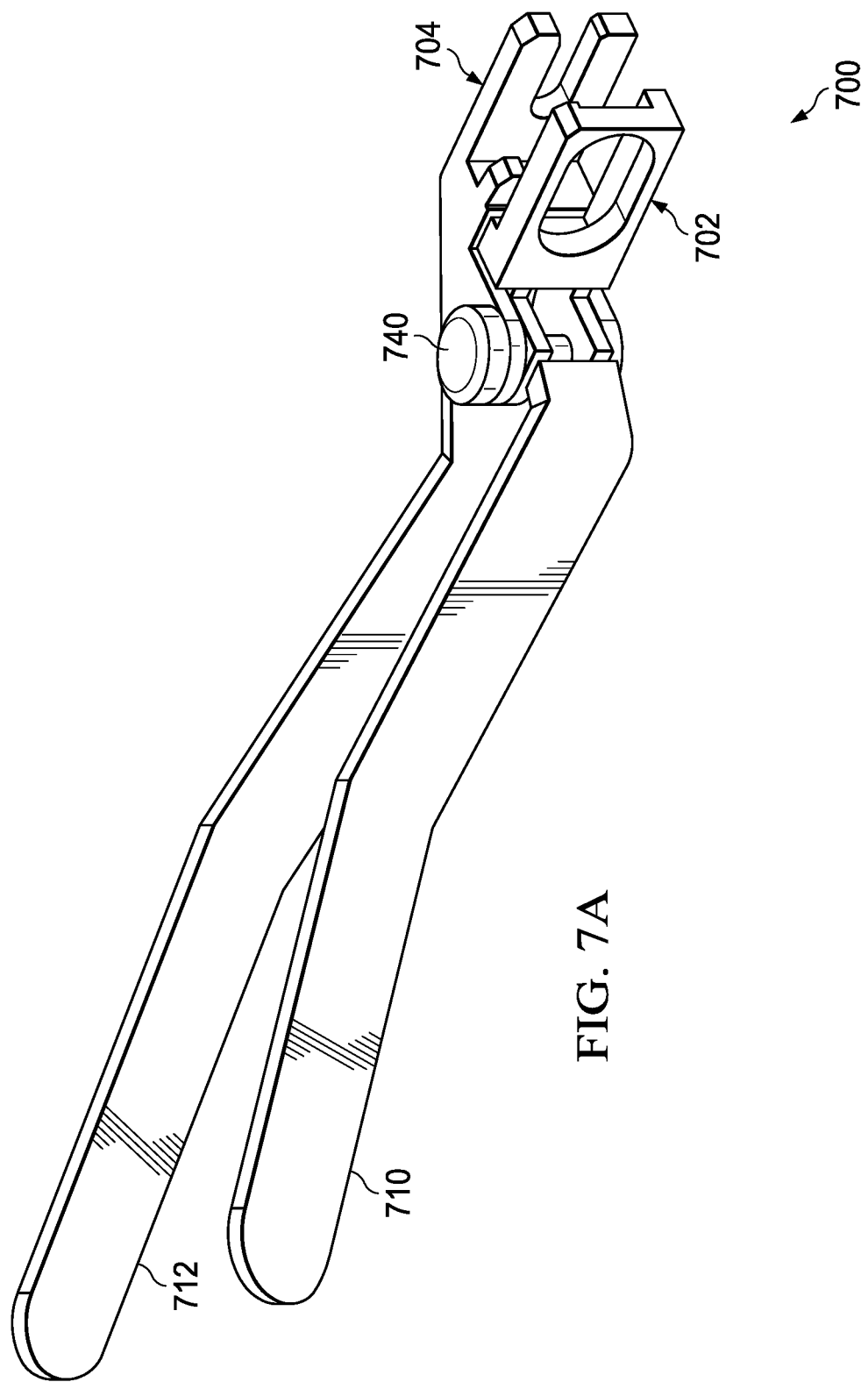
FIG. 7A is a drawing of an embodiment capillary alignment tool.
Figure 7B:
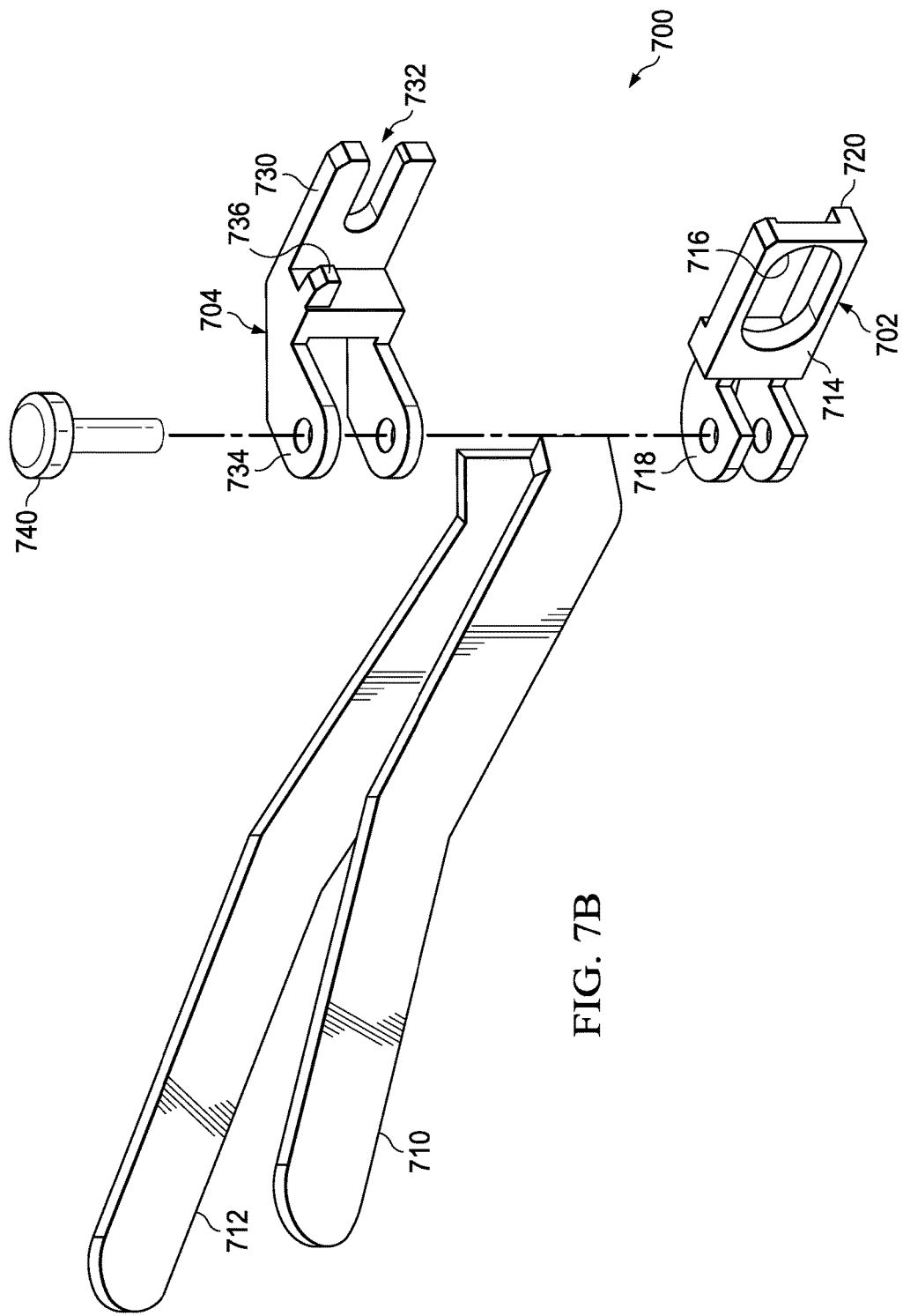
FIG. 7B is an exploded view of an embodiment capillary alignment tool.

One commercially available wire bonding tool is the Twin Eagle™ wire bonder from ASM Pacific Technology, Inc. An embodiment capillary alignment jig 700 for the Twin Eagle™ wire bonder is illustrated in FIG. 7.

The embodiment capillary alignment jig 700 is comprised of a first arm 710 with a first end 702 and a second arm 712 with a second end 704. The two arms, 710 and 712 are connected with a hinge pin 740 similar to a plier hinge. The first arm and second arm are movable toward each other to enable the ends, 702 and 704, grip the transducer 102 of the Twin Eagle™ wire bonder there between.

The first end 702 is comprised of a first side piece 714 which grips the first side of the transducer 102 and a bottom plate 720 which is coupled to the bottom of the side piece 714 and contacts the bottom surface of the transducer for the purpose of vertical alignment. An opening 716 in the side piece 714 allows access for a torque wrench to adjust the capillary installation screw. A first hinge half 718 on the first end 702 is mated with the second hinge half 734 on the second hinge half 704 and hinge pin 740 is inserted into the hinge pinning the first arm 710 and second arm 720 together.

The second end 704 is comprised of a second side piece 730 which grips the second side of the transducer and a top plate 736 which contacts the top surface of the transducer for the purpose of vertical alignment. The top plate 736 also at least partially covers the vertical capillary opening 140 in the transducer 102 to from a capillary stop. When a replacement capillary 104 is inserted into the vertical capillary opening 140 it stops when it comes into contact with the capillary stop providing consistent vertical alignment. A slot 732 in the second end 704 prevents the second side piece 730 from blocking the capillary set screw.

The embodiment capillary alignment jigs, 120 and 700, ensure consistent vertical alignment of the capillary 104 during each installation. This improves the consistency of the ball bonds and the stitch bonds which significantly improves yield. It also reduces the time required to replace the capillary. By ensuring proper vertical alignment of the capillary during replacement, the down time of the wire bonding equipment is reduced.

Implementation of the embodiment capillary alignment jig 120 reduced capillary related errors by more than 30%, reduced down time by more than 10%, increased the number of units processed between capillary changes by more than 15%, reduced capillary consumption by more than 20%, reduced downtime after capillary change from an average of about 13 hr to 0 hr, and reduced the mean time between adjusts (MTBA) by more than 9%. This translates into a significant cost savings.

Figure 8:
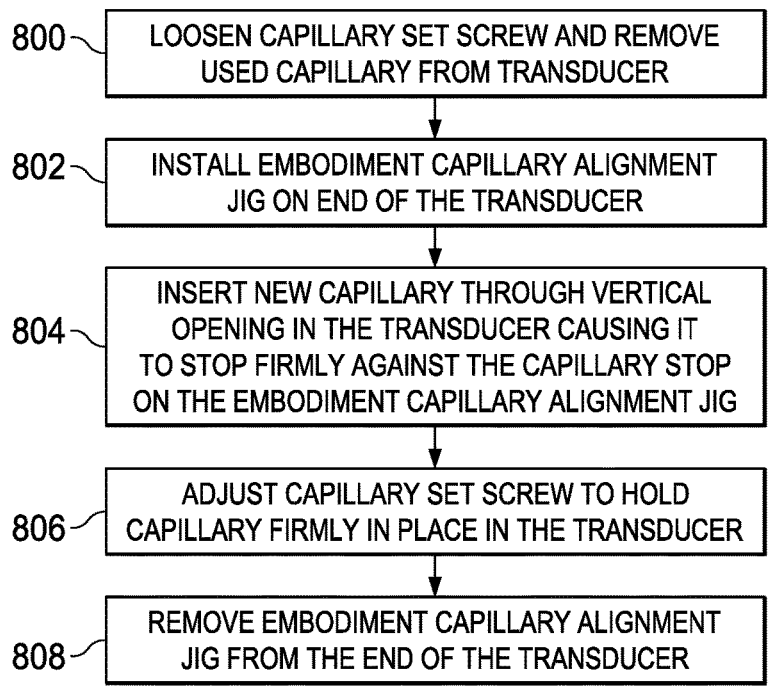
FIG. 8 is a flow diagram describing the steps for replacing a capillary in a transducer.

A method for capillary replacement using an embodiment capillary alignment jig 700 is described in the flow diagram in FIG. 8.

The first step 800 in the capillary replacement procedure is to loosen the capillary set screw and to remove the used capillary from the transducer.

Next step 802 is to install an embodiment capillary alignment jig on the end of the transducer making sure the side plates and the top and bottom plates closely contact the transducer to ensure proper alignment.

In step 804 the new capillary is inserted through the vertical capillary opening in the transducer until it stops firmly against the top plate of the embodiment capillary alignment tool to ensure proper vertical alignment.

With the new capillary properly aligned, in step 806 the capillary set screw is adjusted to hold the new capillary firmly in place.

With the new capillary installed, in step 808 the embodiment capillary alignment jig may be removed.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An apparatus for installing and aligning a wire bonding capillary into a transducer of a wire bonding machine, the apparatus comprising:
    a first arm with a first end;
    a second arm with a second end;
    a first side plate coupled to the first end and a second side plate coupled to the second end, the first and second arms being adapted to grip the sides of the transducer between the first side plate and the second side plate when the apparatus is closed;
    a top plate coupled to a top side of the first side plate and where the top plate is positioned to be in contact with a top surface of the transducer and to at least partially cover a vertical capillary opening through the transducer when the apparatus is closed; and
    a bottom plate coupled to a bottom side of the second side plate and where the bottom plate is positioned to be in contact with a bottom surface of the transducer when the apparatus is closed.

2. The apparatus of claim 1, further comprising a capillary opening in the bottom plate which aligns with the vertical capillary opening when the apparatus is closed.

3. The apparatus of claim 2, wherein the capillary opening is a beveled capillary opening with a large side of the beveled capillary opening facing a bottom surface of the bottom plate.

4. The apparatus of claim 1, further comprising a hinge between the first arm and the second arm and wherein the first arm and the second arm are movable toward each other to grip the sides of the transducer between the first side plate and the second side plate.

5. An apparatus for installing and aligning a capillary into a transducer of an ASM Twin Eagle™ wire bonding machine, the apparatus comprising:
- a first arm coupled to a first end and with a first half of a hinge coupled between the first arm and the first end;
- a second arm coupled to a second end and with a second half of a hinge coupled between the second arm and the second end;
- a first side plate coupled to the first end and adapted to grip a first side of the transducer;
- a second side plate coupled to the second end and adapted to grip a second side of the transducer;
- a bottom plate coupled to the bottom of the first side plate and adapted to contact a bottom surface of the transducer when the apparatus is closed;
- a capillary opening in the bottom plate which aligns with a vertical capillary opening in the transducer when the apparatus is closed;
- a top plate coupled to the top of the second side plate and adapted to contact a top surface of the transducer when the apparatus is closed and where the top plate at least partially covers a vertical capillary opening through the transducer; and
- the first half hinge mated with the second half hinge with a hinge pin inserted through the first half hinge and the second half hinge forming a completed hinge.

6. The apparatus of claim 5, wherein the first arm and the second arm are movable toward each other to grip the transducer between the first side plate of the first end and the second side piece of the second end.

7. The apparatus of claim 5, wherein the top plate and bottom plate constrain the transducer vertically when the apparatus is closed.

8. The apparatus of claim 5, wherein the capillary opening in the bottom plate has a funnel shape with the larger opening facing down.

9. The apparatus of claim 5, further comprising a screw head access opening in the first side plate and a screw access slot in the second side plate.

10. A method of installing a new capillary in a transducer in a wire bonding machine comprising:
- loosening a capillary set screw and removing a used capillary from the transducer;
- installing a capillary alignment tool on the end of the transducer where the capillary alignment tool further comprises:
  - a first arm coupled to a first end and with a first half of a hinge coupled between the first arm and the first end;
  - a second arm coupled to a second end and with a second half of a hinge coupled between the second arm and the second end;
  - a first side plate coupled to the first end and adapted to grip a first side of the transducer;
  - a second side plate coupled to the second end and adapted to grip a second side of the transducer;
  - a bottom plate coupled to the bottom of the first side plate and adapted to contact a bottom surface of the transducer when the apparatus is closed;
  - a capillary opening in the bottom plate which aligns with a vertical capillary opening in the transducer when the capillary alignment tool is closed;
  - a top plate coupled to the top of the second side plate and adapted to contact a top surface of the transducer when the capillary alignment tool is closed and where the top plate at least partially covers a vertical capillary opening through the transducer; and
  - the first half hinge mated with the second half hinge with a hinge pin inserted through the first half hinge and the second half hinge forming a completed hinge;
- inserting a new capillary through the capillary opening and through the vertical capillary opening until the new capillary stops against the top plate;
- tightening the capillary set screw; and
- removing the capillary alignment tool.

11. The method of claim 10, wherein a lead line is inserted through a first end of the capillary and out a second end of the capillary.

12. The method of claim 11, further comprising applying ultrasonic energy to the lead wire causing it to melt and form a free air ball below the second end of the capillary at a first end of the lead wire.

13. The method of claim 12, further comprising lowering the capillary into contact with a bond pad of an integrated circuit.

14. The method of claim 13, further comprising applying pressure and ultrasonic energy to the lead wire to form a ball bond between the bond pad of the integrated circuit and the lead wire.

15. The method of claim 14, further comprising feeding a length of the lead wire through the capillary while moving the capillary to a position over a lead frame.

16. The method of claim 15, further comprising lowering the capillary to bring the lead wire into contact with the lead frame.

17. The method of claim 16, further comprising applying ultrasonic energy to the lead wire causing it to melt and form a bond with the lead frame.

18. The method of claim 17, wherein the bond is a bond stitch between the bond wire and the lead frame.

19. A method of installing a new capillary in a transducer in a wire bonding machine comprising:
- loosening a capillary set screw and removing a used capillary from the transducer,
- installing a capillary alignment tool on an end of the transducer;
- inserting a new capillary through a capillary opening in the transducer until the new capillary stops against a portion of the capillary alignment tool;
- tightening the capillary set screw; and
- removing the capillary alignment tool.

20. The method of claim 19, wherein a lead line is inserted through a first end of the capillary and out a second end of the capillary.

21. The method of claim 20, further comprising applying ultrasonic energy to the lead wire causing it to melt and form a free air ball below the second end of the capillary at a first end of the lead wire.

22. The method of claim 21, further comprising lowering the capillary into contact with a bond pad of an integrated circuit.

23. The method of claim 22, further comprising applying pressure and ultrasonic energy to the lead wire to form a ball bond between the bond pad of the integrated circuit and the lead wire.

24. The method of claim 23, further comprising feeding a length of the lead wire through the capillary while moving the capillary to a position over a lead frame.

25. The method of claim 24, further comprising lowering the capillary to bring the lead wire into contact with the lead frame.

26. The method of claim 25, further comprising applying ultrasonic energy to the lead wire causing it to melt and form a bond with the lead frame.

27. The method of claim 26, wherein the bond is a bond stitch between the bond wire and the lead frame.

28. A method of making an integrated circuit chip package, comprising:
   mounting an integrated circuit on a lead frame;
   coupling the integrated circuit to the lead frame using wire bonding wherein respective lead wires couple respective electrical contacts on the integrated circuit to respective electrical contacts on the lead frame, each lead wire being installed via the following process:
   installing a new capillary in a transducer in a wire bonding machine comprising:
      loosening a capillary set screw and removing a used capillary from the transducer,
      installing a capillary alignment tool on an end of the transducer;
      inserting a new capillary through a vertical capillary opening in the transducer until the new capillary stops against a portion of the capillary alignment tool;
   tightening the capillary set screw; and
   removing the capillary alignment tool.

* * * * *